(12) United States Patent
Nagamine et al.

(10) Patent No.: US 10,490,694 B2
(45) Date of Patent: Nov. 26, 2019

(54) METHOD FOR MANUFACTURING LIGHT EMITTING ELEMENT

(71) Applicant: NICHIA CORPORATION, Anan-shi, Tokushima (JP)

(72) Inventors: Kazuhiro Nagamine, Komatsushima (JP); Yoshiki Inoue, Anan (JP); Susumu Toko, Anan (JP); Junya Narita, Yoshinogawa (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/941,402

(22) Filed: Mar. 30, 2018

(65) Prior Publication Data

US 2018/0287009 A1    Oct. 4, 2018

(30) Foreign Application Priority Data

Mar. 31, 2017  (JP) .................. 2017-069543

(51) Int. Cl.
| | | |
|---|---|---|
| *H01L 33/00* | (2010.01) | |
| *H01L 33/32* | (2010.01) | |
| *H01L 33/42* | (2010.01) | |
| *H01L 33/44* | (2010.01) | |

(52) U.S. Cl.
CPC ...... *H01L 33/0095* (2013.01); *H01L 33/0075* (2013.01); *H01L 33/32* (2013.01); *H01L 33/325* (2013.01); *H01L 33/42* (2013.01); *H01L 33/44* (2013.01); *H01L 2933/0016* (2013.01); *H01L 2933/0025* (2013.01)

(58) Field of Classification Search
None
See application file for complete search history.

(56) References Cited

U.S. PATENT DOCUMENTS

| | | | |
|---|---|---|---|
| 2009/0022199 A1 | 1/2009 | Jikutani et al. | |
| 2012/0061805 A1* | 3/2012 | Amano | ..................... C09J 9/02 257/622 |
| 2012/0295373 A1* | 11/2012 | Bando | ..................... H01L 33/38 438/26 |
| 2014/0319534 A1 | 10/2014 | Miyachi et al. | |

(Continued)

FOREIGN PATENT DOCUMENTS

| | | |
|---|---|---|
| JP | 2002-009392 A | 1/2002 |
| JP | 2002-205180 A | 7/2002 |

(Continued)

*Primary Examiner* — Moazzam Hossain
*Assistant Examiner* — Stanetta D Isaac
(74) *Attorney, Agent, or Firm* — Foley & Lardner LLP

(57) ABSTRACT

A method of manufacturing a plurality of light emitting elements, the method includes: providing a semiconductor wafer; dividing the p-side nitride semiconductor layer into a plurality of demarcated element regions; forming a protective layer on regions including an outer periphery of an upper surface of the p-side nitride semiconductor layer of each of the plurality of demarcated element regions and exposed side surfaces in the semiconductor structure that are formed by the selectively removing the portion of the p-side nitride semiconductor layer; reducing a resistance of regions of the p-side nitride semiconductor layer; and dividing the semiconductor wafer into a plurality of light emitting elements.

18 Claims, 15 Drawing Sheets

(56) References Cited

U.S. PATENT DOCUMENTS

| | | |
|---|---|---|
| 2015/0118775 A1 | 4/2015 | Narita et al. |
| 2016/0284944 A1 | 9/2016 | Narita et al. |
| 2017/0077173 A1* | 3/2017 | Boyama ................ H01L 27/156 |

FOREIGN PATENT DOCUMENTS

| | | |
|---|---|---|
| JP | 2005-166728 A | 6/2005 |
| JP | 2007-318064 A | 12/2007 |
| JP | 2008-098465 A | 4/2008 |
| JP | 2012-231178 A | 11/2012 |
| JP | 2014-160872 A | 9/2014 |
| JP | 2014-216470 A | 11/2014 |
| JP | 2015-088532 A | 5/2015 |
| JP | 2016-184718 A | 10/2016 |

* cited by examiner

METHOD FOR MANUFACTURING LIGHT EMITTING ELEMENT

CROSS-REFERENCE TO RELATED PATENT APPLICATION

The present application claims priority under 35 U. S. C. § 119 to Japanese Patent Application No. 2017-069543, filed on Mar. 31, 2017, the contents of which are hereby incorporated by reference in their entirety.

BACKGROUND

The present disclosure relates to a method of manufacturing a semiconductor element.

A light emitting element can be obtained, for example, by dividing a semiconductor wafer having a substrate having an upper surface, a semiconductor portion including an n-side nitride semiconductor layer and p-side nitride semiconductor layer in order from the upper surface of the substrate. A known method of dividing a semiconductor wafer includes irradiating laser light into the substrate to form a modified region in the substrate and dividing the wafer. In some cases, regions of the semiconductor wafer including intended separation lines may be removed by etching from an upper surface side of the wafer to expose the n-side nitride semiconductor layer, and a protective layer may be disposed on the exposed surfaces. This arrangement can reduce attaching of dust, which is produced when dividing the semiconductor wafer, onto the surfaces exposed by the etching, and thus occurrence of leakage current due to dust can be reduced (see for example, Japanese Unexamined Patent Application Publication No. 2005-166728).

SUMMARY

However, further improvements in reducing occurrence of leakage current seem to be required for the light emitting element disclosed in Japanese Unexamined Patent Application Publication No. 2005-166728.

A method of manufacturing a plurality of light emitting elements according to certain embodiments of the present invention includes: providing a semiconductor wafer including: a substrate and a semiconductor structure that includes an n-side nitride semiconductor layer containing an n-type dopant and located above the substrate, and a p-side nitride semiconductor layer containing a p-type dopant and located above the n-side nitride semiconductor layer; selectively removing a portion of the semiconductor structure from an upper surface side of the semiconductor structure to expose a portion of the n-side nitride semiconductor layer, in regions that include borders of areas to become the plurality of light emitting elements when seen from above, so as to divide the p-side nitride semiconductor layer into a plurality of demarcated element regions; disposing a protective layer on regions including an outer periphery of an upper surface of the p-side nitride semiconductor layer of each of the plurality of demarcated element regions and exposed lateral surfaces of the semiconductor structure that are formed by selectively removing the portion of the semiconductor structure; annealing the semiconductor wafer to reduce a resistance of regions of the p-side nitride semiconductor layer when seen from above, where the protective layer is not provided; irradiating a laser light in an interior region of the substrate so as to form a plurality of modified regions in the substrate; and dividing the semiconductor wafer using the modified regions to obtain the plurality of light emitting elements.

Such a method can provide a plurality of light emitting elements with reduction in leakage current.

DETAILED DESCRIPTION

Figure 1A:
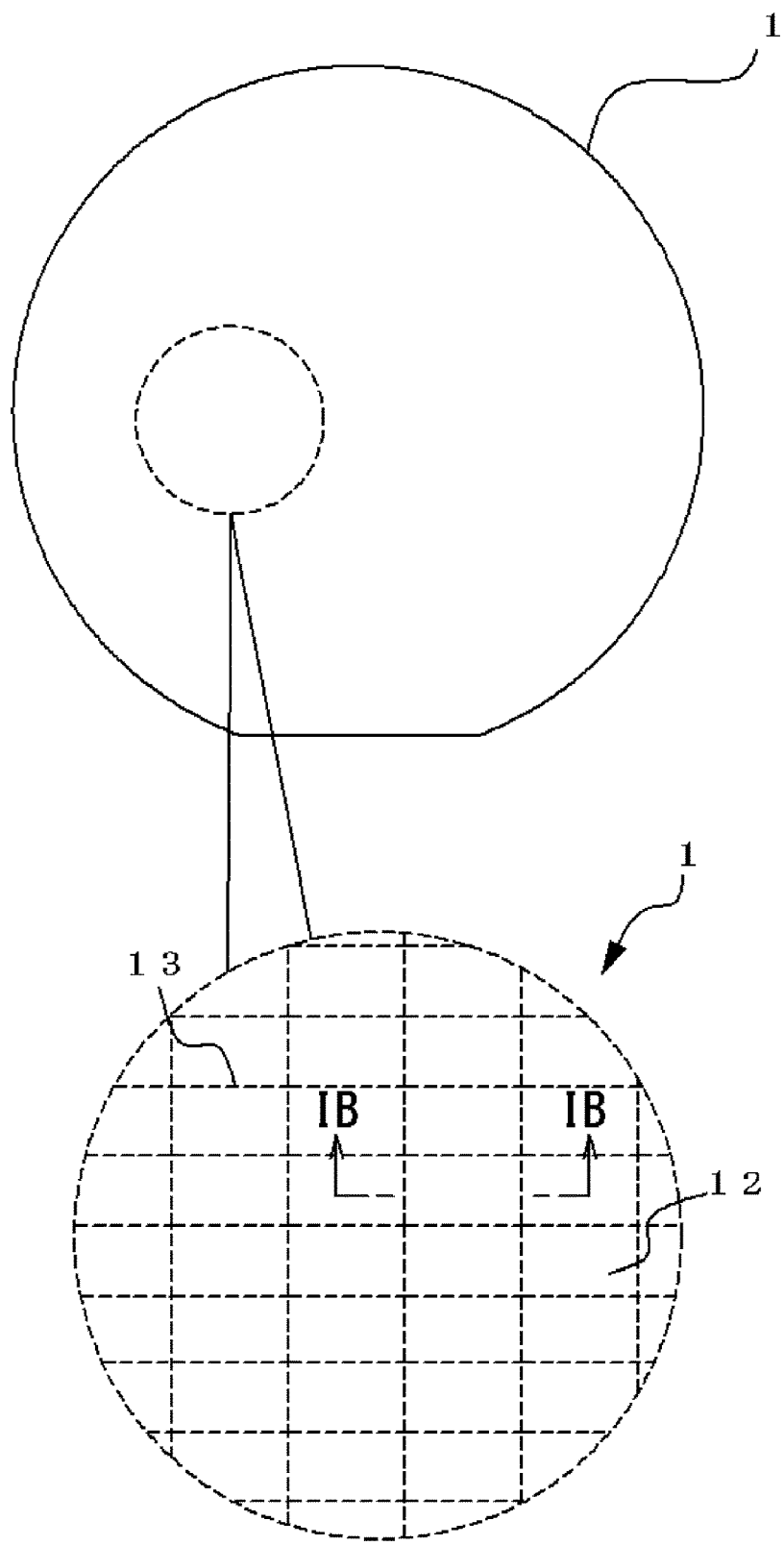
FIG. 1A is a schematic plan view illustrating a method of manufacturing light emitting elements according to a first embodiment of the present disclosure.

Certain embodiments of the present invention will be described below with reference to the drawings. The embodiments shown below are intended as illustrative to give a concrete form to technical ideas of the present invention, and the scope of the invention is not limited to those described below. In the description below, the same designations or the same reference numerals denote the same or like members and duplicative descriptions will be appropriately omitted.

First Embodiment

Figure 1B:
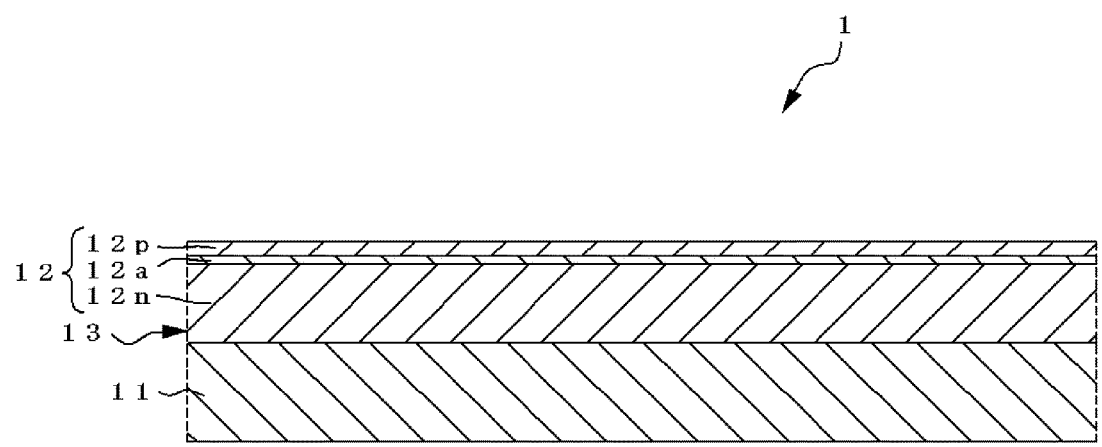
FIG. 1B is a schematic cross sectional view taken along line IB-IB of FIG. 1A.
Figure 2A:
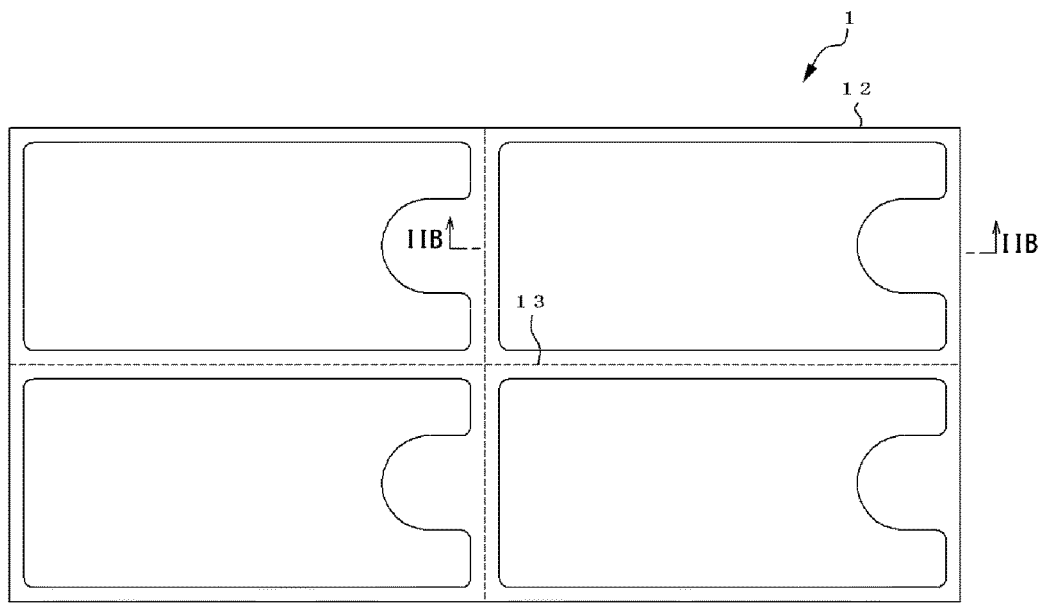
FIG. 2A is a schematic plan view illustrating a method of manufacturing light emitting elements according to the first embodiment.
Figure 2B:
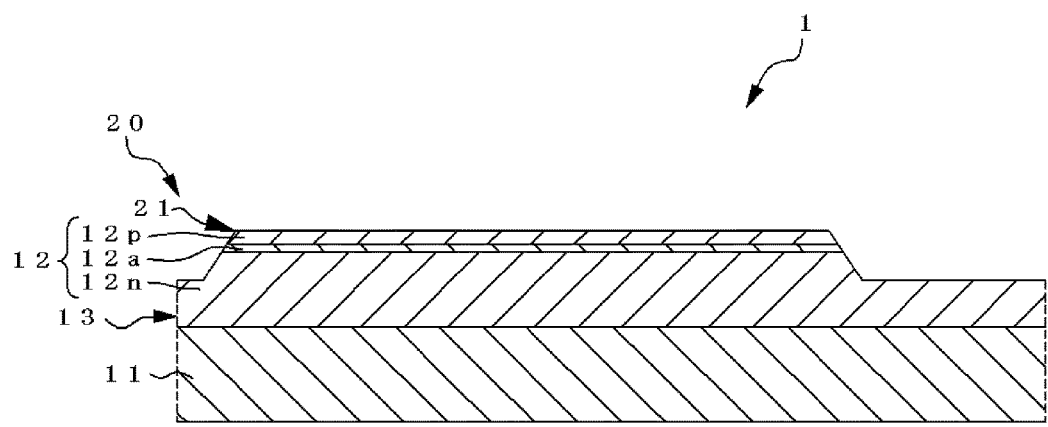
FIG. 2B is a schematic cross sectional view taken along line IIB-IIB of FIG. 2A.
Figure 3A:
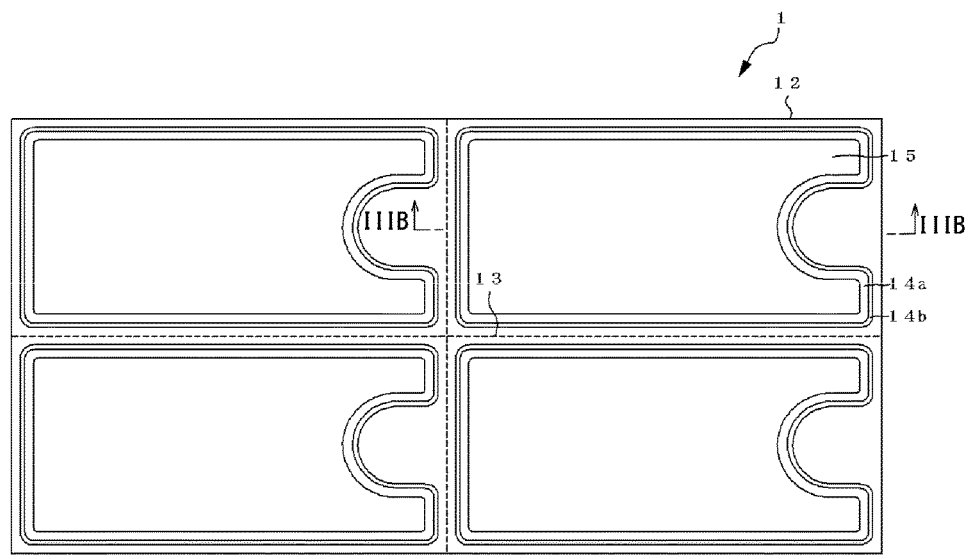
FIG. 3A is a schematic plan view illustrating a method of manufacturing light emitting elements according to the first embodiment.
Figure 3B:
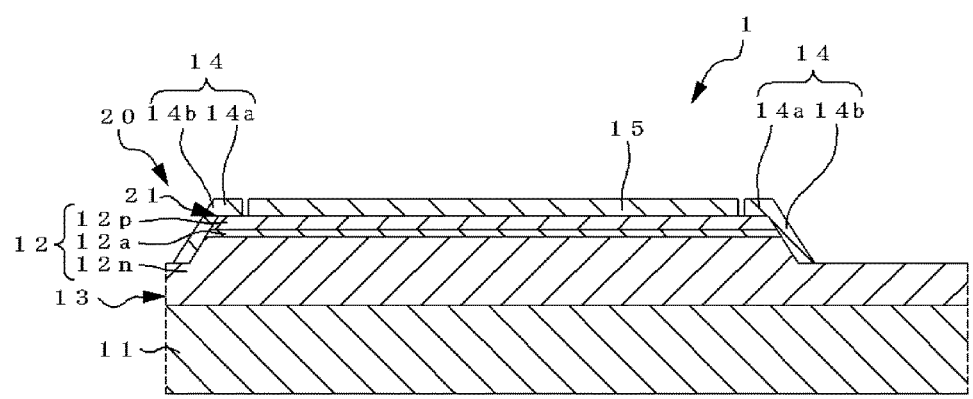
FIG. 3B is a schematic cross sectional view taken along line IIIB-IBB of FIG. 3A.

In a method of manufacturing a plurality of light emitting elements 100 according to a first embodiment, as shown in FIG. 1A and FIG. 1B, a semiconductor wafer 1 includes a substrate 11 having an upper surface and a semiconductor structure 12 that includes an n-side nitride semiconductor layer 12n containing an n-type dopant and located above the upper surface of the substrate 11, and a p-side nitride semiconductor layer 12p containing a p-type dopant and located above the n-side nitride semiconductor layer 12n. For clarity of the drawings and of the description, the cross-sectional view of FIG. 1B illustrates a single portion between adjacent intended separation lines 13, and the same will be applied to the cross-sectional views shown in other accompanying drawings. Accordingly, descriptions below may be given corresponding to each drawing. Subsequently, as shown in FIG. 2A and FIG. 2B, a portion of the semiconductor structure 12 is selectively removed from an upper surface side of the semiconductor structure 12 to expose the n-side nitride semiconductor layer 12n, in regions including borders of areas to become a plurality of light emitting elements 100, so as to divide the p-side nitride semiconductor layer 12p into a plurality of demarcated element regions. The "borders" described above may be referred to as "intended separation line(s) 13" in the description below. For clarity of the drawings and of the description, a schematic plan view of FIG. 2A illustrates four element regions of the semiconductor wafer 1, which are to become four light emitting elements 100, and the same will be applied to the schematic plan views FIGS. 3A, 4A, 5A, 7A, 8A, 10A, 11A, and 13A. Accordingly, descriptions below may be given corresponding to each drawing, or corresponding to a single element region that is to become a single light emitting element 100. Subsequently, as shown in FIG. 3A and FIG. 3B, a first protective layer 14 is disposed on regions including an outer periphery of an upper surface of the p-side nitride semiconductor layer 12p of each of the plurality of demarcated element regions and exposed side surfaces in the semiconductor structure 12 that are formed by selectively removing the portion of the semiconductor structure 12. The portion of the first protective layer 14 disposed on the upper surface portions of the p-side nitride semiconductor layer 12p may be referred to as "first portion 14a of first protective layer(s) 14" and the portion of the first protective layer 14 disposed on the lateral surfaces of the semiconductor structure 12 may be referred to as "second portion 14b of first protective layer(s) 14."

Figure 4A:
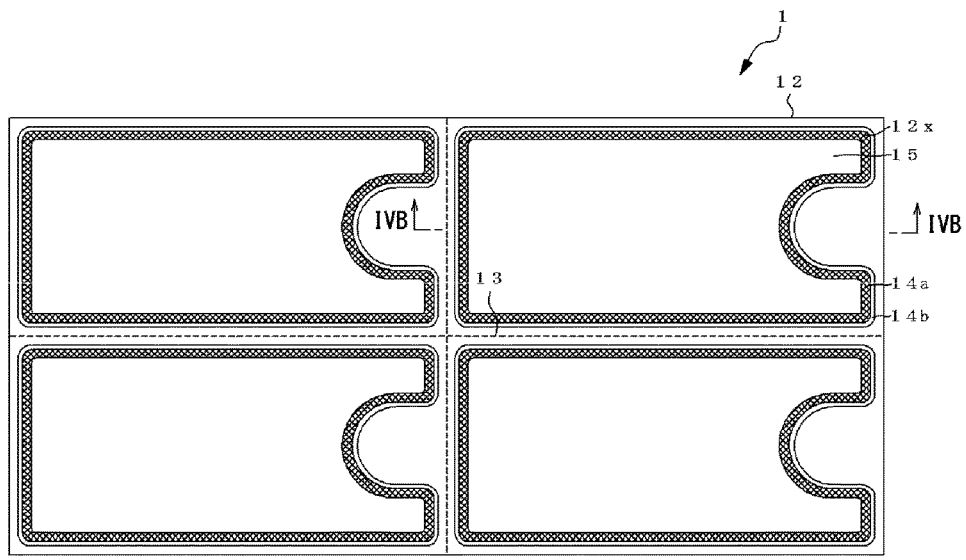
FIG. 4A is a schematic plan view illustrating a method of manufacturing light emitting elements according to the first embodiment.
Figure 4B:
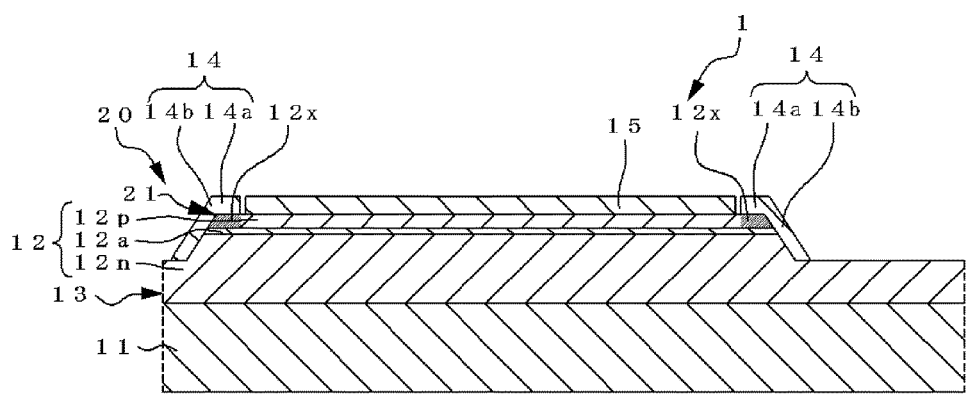
FIG. 4B is a schematic cross sectional view taken along line IVB-IVB of FIG. 4A.
Figure 5A:
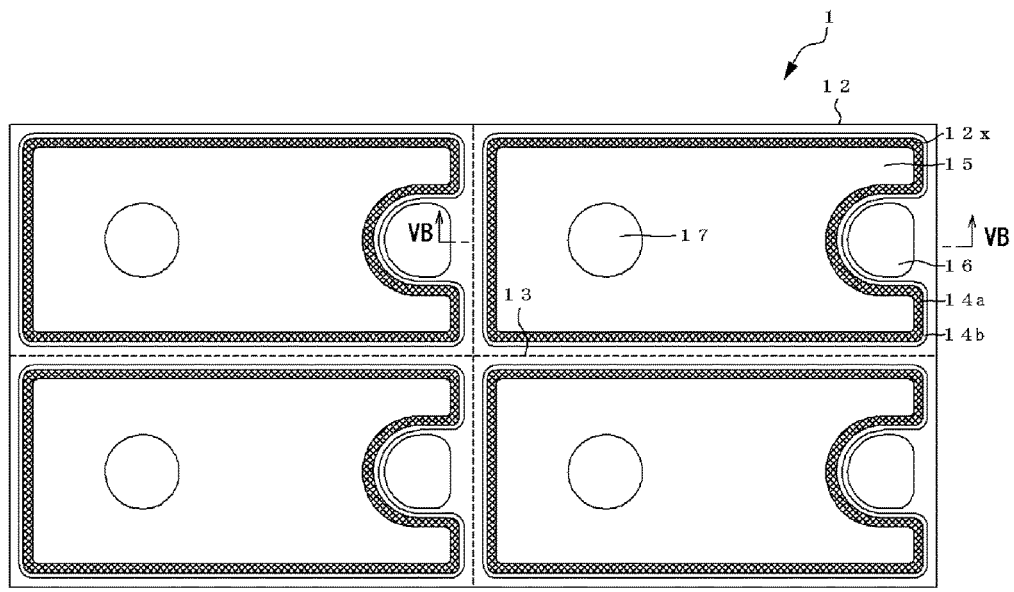
FIG. 5A is a schematic plan view illustrating a method of manufacturing light emitting elements according to the first embodiment.
Figure 5B:
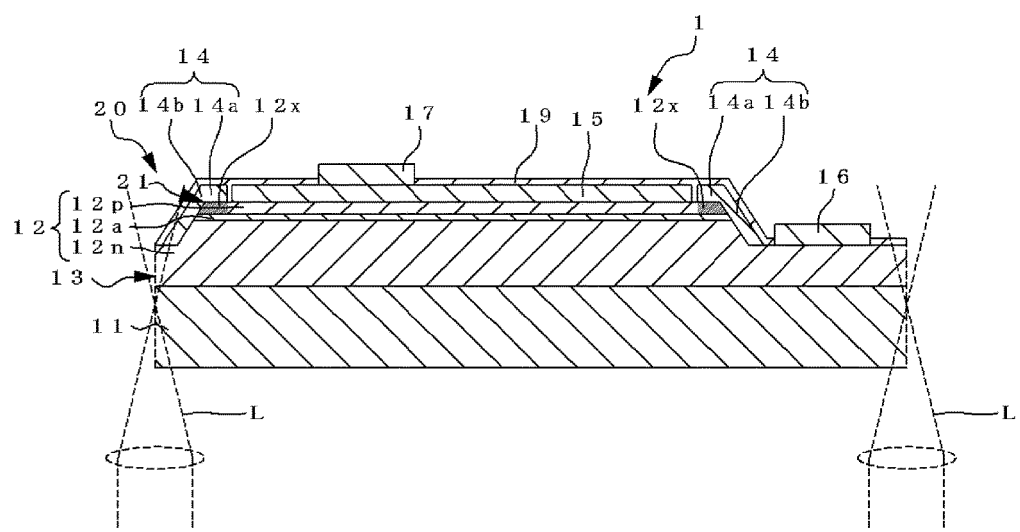
FIG. 5B is a schematic cross sectional view taken along line VB-VB of FIG. 5A.
Figure 6A:
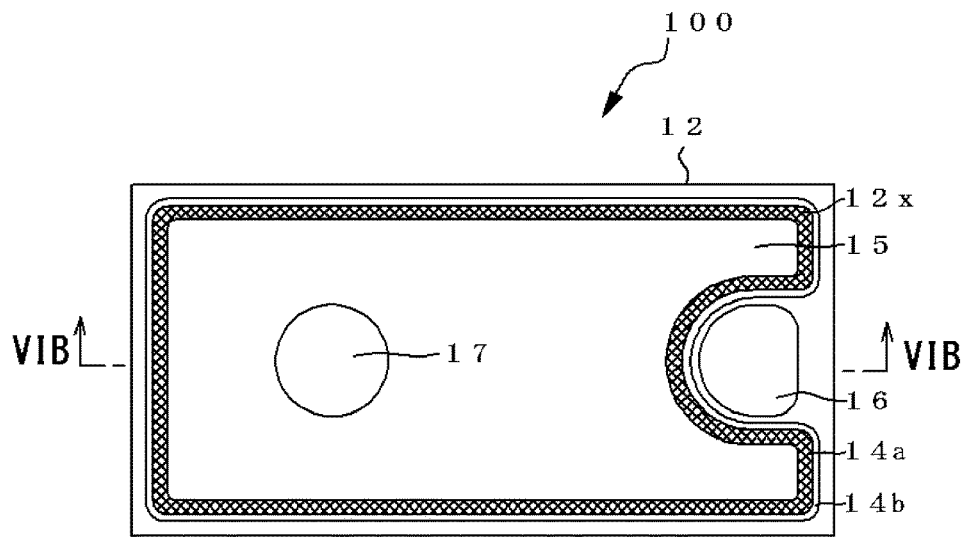
FIG. 6A is a schematic plan view illustrating a method of manufacturing light emitting elements according to the first embodiment.
Figure 6B:
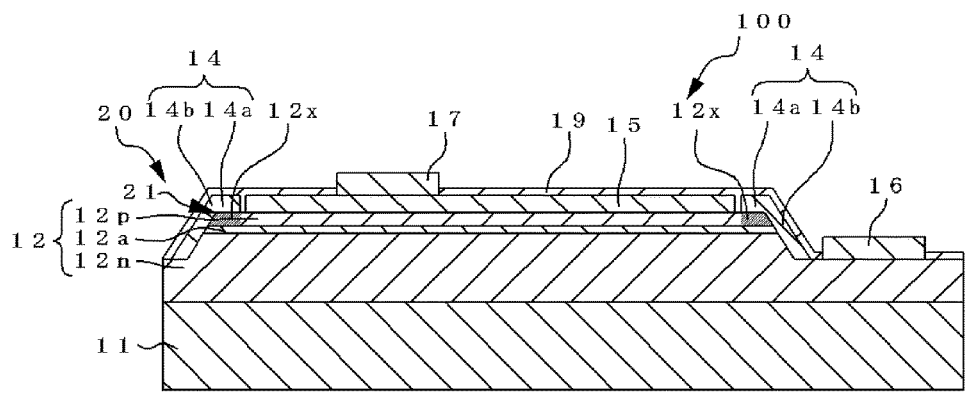
FIG. 6B is a schematic cross sectional view taken along line VIB-VIB of FIG. 6A.

Subsequently, as shown in FIG. 4A and FIG. 4B, the semiconductor wafer 1 is subjected to annealing (a thermal treatment) to reduce the resistance of the p-side nitride semiconductor layer 12p mainly in the regions other than where the first portion 14a of the first protective layer 14 is disposed, when seen from above. It is assumed that in the region of the p-side nitride semiconductor layer 12p other than where the first portion 14a of the first protective layer 14 is disposed, the hydrogen which inhibits activation of the p-type dopant is released from the p-type dopant by annealing, while releasing of the hydrogen is difficult in the region provided with the first portion 14a of the first protective layer 14. Thus, a reduction in the resistance in the region of the p-side nitride semiconductor layer 12p where the first protective layer 14a is not disposed can be achieved but a high resistance is maintained in the region of the p-side nitride semiconductor layer 12p where the first portion 14a of the first protective layer 14 is disposed. Then, as shown in FIG. 5A and FIG. 5B, a laser light L is irradiated in an interior region of the substrate 11 to form a plurality of modified regions. The semiconductor wafer 1 with the substrate 11 formed with the modified regions is divided to obtain a plurality of light emitting elements 100 as shown in FIG. 6A and FIG. 6B.

In conventional techniques, the p-side nitride semiconductor layer 12p and other portions are partially removed to form a recess 20 in the semiconductor structure 12 and then the laser light L is irradiated to the substrate 11. In this case, damage to the p-side nitride semiconductor layer 12p may be caused by the laser light L that has a certain width, which may result in occurrence of current leakage, unless a sufficiently large region is removed from the semiconductor structure 12. As a result of thorough study, the inventors of the present invention have found that spatial concentration of the laser beam L tends to occur at and around the portions where lateral surface(s) of the recess 20 in the semiconductor structure, which is formed by selectively removing a portion of the p-side nitride semiconductor layer 12p etc., and the upper surface of the semiconductor structure 12 meet (hereinafter may be referred to as "corner portion(s) 21"), and the spatial concentration of the laser light may result in damage to the p-side nitride semiconductor layer 12p. Although the details of the occurrence of energy concentration of the laser light L to the corner portion(s) 21 are not well known, the main cause of such a damage is assumed that the laser light L is reflected and/or refracted at the recess 20 formed in the semiconductor structure 12, and concentrated to the corner portion(s) 21. Another main cause of such damage is assumed that the p-side nitride semiconductor layer 12p is more susceptible to damage caused by the laser light L than the n-side nitride semiconductor layer 12n. In the description below, occurrence of locally increased flow of electric current along a particular region such as a damaged region when the electric current is supposed to be distributed uniformly to some extent over a certain region of the semiconductor structure 12, such an occurrence may be described as "leakage current occurs."

Meanwhile, in the first embodiment, the corner portions 21 where the laser light L tends to concentrate, which likely causes damage therein, are provided with a high-resistance portion 12x of the p-side nitride semiconductor layer 12p. Accordingly, even if damage is caused in the region that includes the corner portion 21, leakage current due to the damage is unlikely to occur, because the corner portion has a high resistance. Because the region of the p-side nitride semiconductor layer 12p with a low resistance does not include the corner portion 21, concentration of laser light L is difficult in the region and thus damage by the laser light L is unlikely to occur. Accordingly, in the first embodiment, leakage current can be reduced compared to that in a conventional method, and the electric current contribute to emission of light can be increased. Thus, when the light emitting elements 100 of similar size are formed, an increase in the optical output can be expected despite a decrease in the light emitting regions.

The respective steps will be described below.

Providing Semiconductor Wafer

As shown in FIG. 1A and FIG. 1B, a semiconductor wafer 1 including a substrate 11, an n-side nitride semiconductor layer 12n containing an n-type dopant and located above an upper surface of the substrate, and a p-side nitride semiconductor layer 12p containing a p-type dopant and located above the n-side nitride semiconductor layer 12n is provided. In the first embodiment, the semiconductor wafer 1 includes an active layer 12a between the n-side nitride semiconductor layer 12n and the p-side nitride semiconductor layer 12p. The n-side nitride semiconductor layer 12n, the active layer 12a, and the p-side nitride semiconductor layer 12p may be collectively referred to as the "semiconductor structure 12." For each of the layers that form the semiconductor structure 12, for example, a nitride semiconductor such as $In_XAl_YGa_{1-X-Y}N$ ($0 \leq X$, $0 \leq Y$, $X+Y \leq 1$) can be used. Specific examples of the n-type dopant include Si and specific examples of the p-type dopant include Mg. For the substrate 11, an insulating substrate made of sapphire or the like, or a conductive substrate made of GaN, SiC, ZnS, ZnO, GaAs, Si or the like can be employed. The upper surface of the substrate 11 may be provided with an underlayer such as a low-temperature growth buffer layer.

In the present specification, with the interface between the p-side nitride semiconductor layer 12p and the n-side nitride semiconductor layer 12n or with the active layer 12a as the border, a side of the semiconductor structure 12 where a p-electrode is to be provided is indicated as the p-side nitride semiconductor layer 12p, and a side of the semiconductor structure 12 where an n-electrode is to be provided is indicated as the n-side nitride semiconductor layer 12n.

Partially Removing Semiconductor Portion

Subsequently, as shown in FIG. 2A and FIG. 2B, a portion of the semiconductor structure 12 that include borders (intended separation lines 13) of areas to become a plurality of light emitting elements 100 is selectively removed from an upper surface side of the semiconductor structure 12 to expose the n-side nitride semiconductor layer, so as to divide the p-side nitride semiconductor layer into a plurality of demarcated element regions. The intended separation lines 13 of the semiconductor wafer 1 can be set to obtain the light emitting elements 100 of a desired peripheral shape when dividing the semiconductor wafer in a later step, and the intended separation lines 13 are typically arranged in a lattice-shape when seen from above, as shown in FIG. 1A and other figures of the accompanying drawings. With the intended separation lines 13 of the semiconductor wafer 1 set in a lattice-shape, the light emitting elements 100 having a quadrangular shape when seen from above can be obtained. The shape of the light emitting elements 100 when seen from above can also be a hexagonal shape or any appropriate shape. The width of the portion of the semiconductor structure 12 to be removed, which is typically a width perpendicular to the intended separation lines 13, is preferably 5 µm or greater, more preferably 15 µm or greater. This arrangement can facilitate disposing of the second portion 14b of the first protective layer 14 on the lateral surfaces of the semiconductor structure 12 that are exposed by removing the portion of the semiconductor structure 12. The width of the regions of the semiconductor structure 12 to be removed is preferably 50 µm or less, more preferably 20 µm or less. With this arrangement, the light emitting regions of the light emitting elements 100 can be further increased.

In the first embodiment, as shown in FIG. 2A and FIG. 2B, in addition to the region removed as described above, other portions of the semiconductor structure 12 are removed from the p-side nitride semiconductor layer 12p side by etching to expose the n-side nitride semiconductor layer 12n, to provide regions for disposing n-pad electrodes 16 in a later step.

Disposing Protective Layer

Subsequently, as shown in FIG. 3A and FIG. 3B, a first portion 14a of the first protective layer 14 and a second portion 14b of the first protective layer 14 are disposed on regions including an outer periphery of an upper surface of the p-side nitride semiconductor layer 12p of each of the plurality of demarcated element regions, and exposed lateral surfaces of the semiconductor structure 12 that are formed by selectively removing the portion of the semiconductor structure 12, respectively. More specifically, predetermined regions are covered by a mask and a first portion 14a of the first protective layer 14a is disposed on an outer peripheral portion of the upper surfaces of the p-side nitride semiconductor layer 12p in the element region, while simultaneously disposing a second portion 14b of the first protective layer 14 on the lateral surface of the semiconductor structure 12 that are formed by removing the portion of the semiconductor structure 12. The first portion 14a and the second portion 14b of the first protective layer 14 can be disposed in separate steps, but as in the first embodiment, the first portion 14a of the first protective layer 14 and the second portion 14b of the first protective layer 14 are preferably simultaneously disposed. Accordingly, the number of steps in manufacturing the light emitting elements 100 can be reduced. In the first embodiment, the first protective layer 14 is disposed on the entire outer periphery of each of the element regions. Note that as shown in FIG. 3A, when the region to dispose the n-pad electrode 16 is provided outside of each of the element regions, the protective layer 14 does not have to be disposed to the portion of the outer periphery of the element region to face the n-pad electrode 16, because the portion has a distance from the closest part of intended separation line 13.

For the protective layer 14, $SiO_2$, SiN, SiON, $Al_2O_3$, ZnO, $ZrO_2$, $TiO_2$, $Nb_2O_5$, $Ta_2O_5$, or the like can be used, and of those, $SiO_2$ is typically used. The protective layer 14 can be formed by depositing a material of the protective layer 14 on the semiconductor wafer 1 by way of CVD, sputtering, or the like.

Preferably, the first portion 14a of the first protective layer 14 has a thickness of 0.01 µm or greater, and more preferably, 0.2 µm or greater. With this arrangement, a reduction of the resistance can be more reliably reduced or prevented in the region of the p-side nitride semiconductor layer 12p provided with the first portion 14a of the first protective layer 14. The first portion 14a of the first protective layer 14 preferably has a thickness of 1 µm or less, more preferably 0.5 µm or less. With this arrangement, occurrence of crack in the first portion 14a of the first protective layer 14 can be reduced or prevented.

When seen from above, the first portion 14a of the first protective layer 14 preferably has a width, which is typically a width perpendicular to its adjacent intended separation line 13, of 1 µm or greater, more preferably 5 µm or greater. With this arrangement, a reduction of the resistance can be prevented in the region of the p-side nitride semiconductor layer 12p provided with the first portion 14a of the first protective layer 14. When seen from above, the first portion 14a of the first protective layer 14 has a width of, preferably 50 µm or less, more preferably 20 µm or less, further preferably 15 µm or less. With this arrangement, the size of the region in the p-side nitride semiconductor layer 12p with a low resistance can be increased.

The second portion 14b of the first protective layer 14 preferably has a thickness of about 0.01 µm or greater, more preferably 0.2 µm or greater. With this arrangement, even when a dust is attached to the region provided with the second portion 14b of the first protective layer 14, the influence of the dust can be more efficiently reduced. The second portion 14b of the first protective layer 14 preferably has a thickness of 1 µm or less, more preferably 0.5 µm or less. With this arrangement, occurrence of crack in the second portion 14b of the first protective layer 14 can be reduced or prevented.

In the first embodiment, after the first protective layer 14 is disposed, a current diffusion layer 15 is disposed on an approximately the entire region of the upper surface of the p-side nitride semiconductor layer 12b where the first protective layer 14 is not disposed. With this arrangement, more uniform electric current density distribution can be obtained in the plane of each of the light emitting elements 100, and thus the light emitting efficiency of the light emitting elements 100 can be improved. The timing of disposing the current diffusion layer 15 may take place, for example, before disposing the first protective layer 14 or after reducing the resistance of the p-side nitride semiconductor layer 12p to be described further below.

Disposing the current diffusion layer 15 after reducing the resistance of the p-side nitride semiconductor layer 12p allows for employing a certain material for the current diffusion layer 15, even if the material inhibits the reduction of the resistance of the p-side nitride semiconductor layer 12p.

For the current diffusion layer 15, for example, a conductive metal oxide such as ITO, ZnO, $In_2O_3$, or the like can be used. When the current diffusion layer 15 is also used as a reflecting layer, Ag or the like can be used. The current diffusion layer 15 can be disposed by, for example, depositing a material of the current diffusion layer 15 on the upper surface of the p-side nitride semiconductor layer 12p by sputtering or the like. In the case the current diffusion layer 15 is also used as a reflecting layer, the light extraction side of the light emitting element is typically the n-side nitride semiconductor 12n side.

When seen from above, the distance between the current diffusion layer 15 and the first portion 14a of the first protective layer 14 is preferably 0 µm or greater, more preferably 2 µm or greater. Providing a distance greater than a certain value between the current diffusion layer 15 and the first portion 14a of the first protective layer 14 can reduce the amount of light absorbed by the current diffusion layer 15 along the outer periphery of the light emitting element 100 where light emission decreases, so that the light extraction efficiency can be improved. When seen from above, the distance between the current diffusion layer 15 and the first portion 14a of the first protective layer 14 is preferably 20 µm or less, more preferably 10 µm or less. With this arrangement, a larger area in the light emitting element 100 can be allowed for the current diffusion layer 15, so that the forward voltage (Vf) can be reduced.

Reducing Resistance of p-Side Nitride-Based Semiconductor Layer

Subsequently, the semiconductor wafer 1 is subjected to annealing to reduce the resistance of the p-side nitride semiconductor layer 12p in the regions, when seen from above, where the first portion 14a of the first protective layer 14 is not disposed. Thus, high resistance can be maintained in the regions of the p-side nitride semiconductor layer 12p having the first protective layer 14, thus providing high-resistance portions 12x. Accordingly, even when damage to the semiconductor structure 12 is caused upon irradiating a laser light L to the semiconductor wafer 1 in a step to be described further below, occurrence of leakage current through the damaged region can be reduced or prevented. For the sake of easy understanding, the regions of the p-side nitride semiconductor layer 12p corresponding to the high resistance portions 12x are indicated by crosshatching and shading in FIG. 4A and FIG. 4B, respectively. Such indications are also applied in FIGS. 5A to 6B, and FIG. 8A to FIG. 12B.

Annealing is preferably performed in an atmosphere that substantially does not contain hydrogen. Typically and preferably, annealing is performed in a nitrogen atmosphere. The semiconductor wafer 1 is preferably annealed at a temperature in a range of 350° C. to 600° C. The semiconductor wafer 1 is preferably annealed for a time period in a range of 10 minutes to 60 minutes. Accordingly, the resistance of the p-side nitride semiconductor layer 12p can be efficiently reduced.

Subsequently, as shown in FIG. 5A and FIG. 5B, an n-pad electrode 16 and a p-pad electrode 17 are disposed on the semiconductor structure 12. In the first embodiment shown in FIG. 5A and FIG. 5B, a second protective layer 19 is disposed to cover substantially entire upper surface of the semiconductor wafer 1 except for portions of the upper surfaces of the n-pad electrodes 16 and the p-pad electrodes 17. As in the first embodiment, the second protective layer 19 can be disposed to cover the first protective layer 14, or the second protective layer 19 can be disposed after removing the first protective layer 14. The second protective layer 19 can be disposed by using the material and method that are used for the first protective layer 14.

Irradiating Laser Light

Subsequently, as shown in FIG. 5A and FIG. 5B, the laser beam L is irradiated to the substrate 11, to the regions corresponding to the intended separation lines 13. The irradiation of the laser light L is focused inside the substrate 11 to form a plurality of modified regions in the substrate 11. The plurality of modified regions can be used as start points for dividing the semiconductor wafer 1, and thus, dividing the semiconductor wafer 1 in a later step can be facilitated. In order to minimize the damage to the semiconductor structure 12, it is preferable to irradiate the laser light L from the substrate 11 side of the semiconductor wafer 1 that is the bottom surface side of the semiconductor wafer 1.

A laser processing device provided with a laser source for emitting laser light (L) that can produce such a modified region can be employed. Specific examples of such a laser processing device include a fiber laser, a $CO_2$ laser, and a YAG laser. The laser light L of a wavelength in a range of 200 nm to 5,000 nm, preferably in a range of 360 nm to 2,000 nm can be used. The pulse width of the laser light L in a range of 10 fsec to 10 µsec, preferably in a range of 100 fsec to 1 nsec can be employed. The laser light L preferably has an output power in a range of 0.01 W to 10 W.

In the first embodiment, the regions including the corner portions 21 are designed to have high resistance, and regions of reduced resistance do not include any corner portions 21. Accordingly, assuming that the width of the recess 20 perpendicular to the intended separation line 13, in other words, the shortest distance between an upper opening edge of the recess 20 and intended separation line 13, is substantially the same in a conventional configuration and the configuration in the first embodiment (i.e., present configuration), less damage to the present configuration will result when the laser light L is irradiated to the region in the substrate 11 equivalently closer to the semiconductor structure 12 in the conventional configuration and in the present configuration. Thus, with the present configuration, locations to irradiate the laser light L can be set closer to the semiconductor structure 12.

Meanwhile, for example, depending on the crystal orientation of the substrate 11, at the time of dividing the semiconductor wafer 1, dividing of the semiconductor wafer 1 initiated from the modified region that is formed by the irradiation of the laser light L may occur at an angle instead of substantially perpendicular to the upper surface and the lower surface of the wafer 1 that are substantially in parallel to each other. In such a case, a certain degree of deviation from the intended separation line 13 may cause the resulting light emitting element(s) 100 be defective.

However, as described above, compared to a conventional configuration, the configuration according to the first embodiment allows for creating the regions in the substrate 11 to be irradiated by the laser light L, that is, creating the modified regions, set closer to the semiconductor structure 12. The region to form the modified regions can be, for example, within an upper half of the thickness of the substrate 11. This allows for a reduction of deviation from the intended separation line 13, which can lead to an improvement in the production yield.

A single modified region may be a single modified portion along the thickness direction of the substrate 11, or may include two or more modified portions formed at different depths along the thickness direction of the substrate 11. With the two or more modified portions formed in the thickness direction, even when the semiconductor wafer 1 includes a thick substrate 11, the semiconductor wafer 1 can be divided relatively easily. When two or more modified portions are formed along the thickness direction of the substrate 11 in a single modified region, the deviation from the intended separation line 13 can be reduced by, for example, creating the modified portion that is proximate to the semiconductor structure 12 at a location within the upper half of the thickness of the substrate 11.

Further, creating the modified regions closer to the semiconductor structure 12 can facilitate the light emitted from the semiconductor structure 12 toward the substrate 11 to reach the modified regions earlier. Accordingly, a larger quantity of light can be reflected at the modified regions that have surfaces roughened by the laser light L, and thus the amount of light extracting from the light emitting element 100 can be increased.

When two or more modified portions are formed along the thickness direction of the substrate 11, after creating a first modified portion, a second modified portion may be formed above the first modified portion. In such a case, for example, the first modified portion is formed by irradiating the laser light L with a first pulse energy and at a first pitch to a first location in the substrate 11, and the second modified portion is formed by irradiating the laser light L with a second pulse energy that is lower than the first pulse energy and at a second pitch that is lower than the first pitch to a second location above the first location in the substrate 11. Thus, light extraction from the light emitting element 100 can be enhanced by forming the modified regions at locations closer to the semiconductor structure 12, while damage to the semiconductor structure 12 can be reduced. In order to form each modified region of a sufficient size to separate the semiconductor wafer 1, irradiation of the laser light L to an interior of the substrate 11 is needed with a relatively high pulse energy and a relatively high pitch, which may cause damage to the semiconductor structure 12 when the modified portion is formed at a location relatively close to the semiconductor structure 12. However, when the second modified portion is formed by irradiating the laser light L to a second location above the first location in the substrate 11, with a second pulse energy that is lower than the first pulse energy and at a second pitch that is lower than the first pitch, damage to the semiconductor structure 12 caused by the laser light L can be reduced compared to that when the second modified portion is formed by the laser light L with the first pulse energy and at the first pitch.

In creating the first modified portion and the second modified portion, the first modified portion can be formed in the lower half of the thickness of the substrate 11 and the second modified portion can be formed in the upper half of the thickness of the substrate 11. Thus, light extraction from the light emitting element 100 can be enhanced by forming the modified regions in the substrate 11 at locations closer to the semiconductor structure 12, while damage to the semiconductor structure 12 can be further reduced.

In the configuration according to the first embodiment, the high-resistance portions 12x are arranged at portions of the lateral surfaces of the semiconductor structure 12, which allows for irradiation of the laser light L with a higher pulse energy than a conventional configuration. Accordingly, even when a relatively thick substrate 11is used, the semiconductor wafer 1 can be easily divided.

More specifically, the substrate 11 may have a thickness in a range of 50 µm to 500 µm when the substrate 11 is divided. The laser light L is irradiated to the interior of the substrate 11, at one or more locations preferably in a range of 10 µm to 150 µm, more preferably in a range of 20 µm to 100 µm from the upper surface of the substrate 11. In other words, the modified portions are preferably formed at locations in a range of 10 µm to 150 µm, more preferably in a range of 20 µm to 100 µm from the upper surface of the substrate 11. Accordingly, the semiconductor wafer 1 can be divided with high accuracy while reducing the damage to the semiconductor structure 12.

Dividing Semiconductor Wafer

After creating the modified regions the semiconductor wafer 1 can be divided along the intended separation lines 13 to obtain a plurality of individual light emitting elements 100 as shown in FIG. 6A and FIG. 6B. The dividing of the semiconductor wafer 1 may be carried out, for example, by applying a force to a roller or a blade which is placed on the lower surface of the substrate 11 of the semiconductor wafer 1.

Second Embodiment

A method of manufacturing a plurality of light emitting elements 200 according to a second embodiment differs from that in the first embodiment in that the steps in between the step of providing the semiconductor wafer 1 and the step of forming modified regions in the substrate 11 are changed to steps of disposing a first portion 14a of a first protective layer 14, reducing a resistance of the p-side nitride semiconductor layer 12p, selectively removing a portion of the semiconductor structure 12, and disposing a second portion 14b of the first protective layer 14. Repetitive descriptions that are similar to those in the first embodiment will be appropriately omitted below.

Figure 7A:
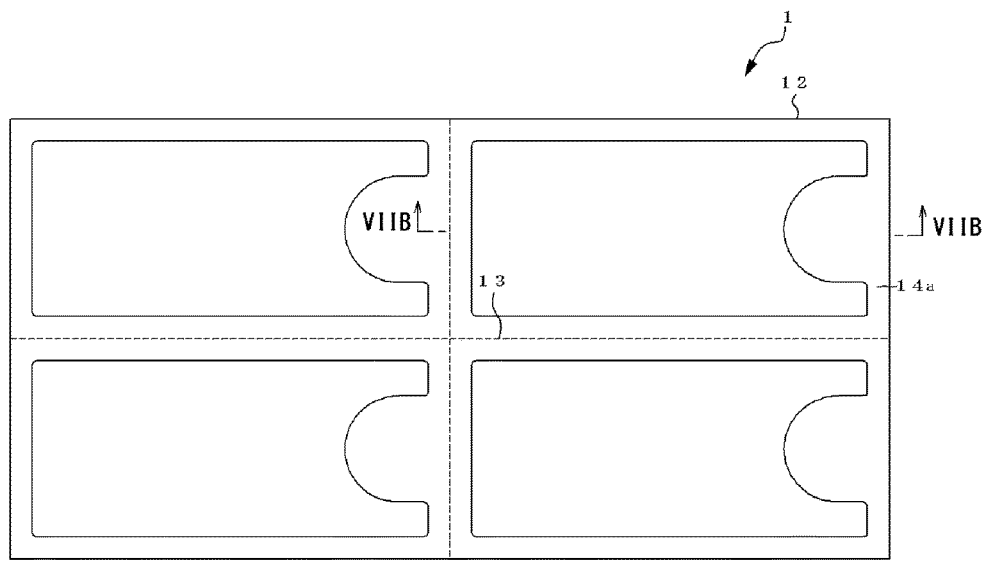
FIG. 7A is a schematic plan view illustrating a method of manufacturing light emitting elements according to a second embodiment of the present disclosure.
Figure 7B:
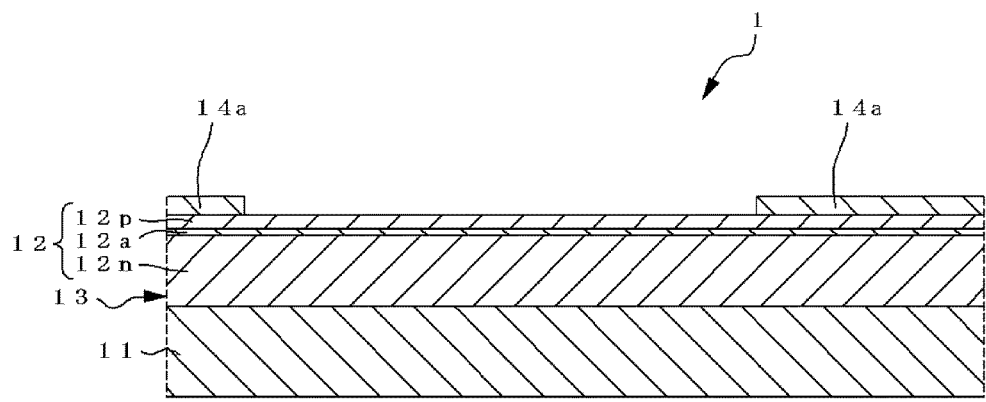
FIG. 7B is a schematic cross sectional view taken along line VIIB-VIIB of FIG. 7A.
Figure 8A:
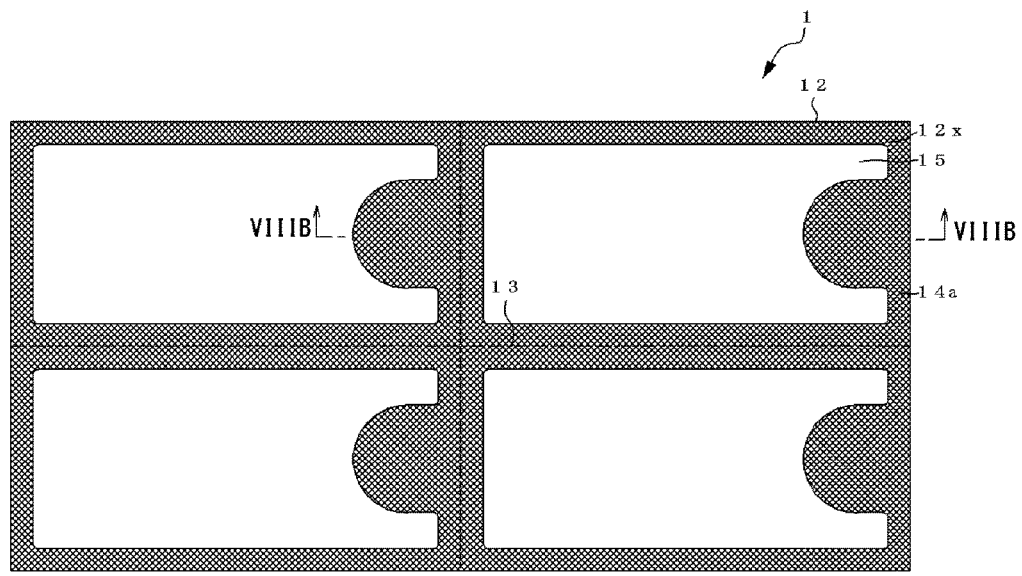
FIG. 8A is a schematic plan view illustrating a method of manufacturing light emitting elements according to the second embodiment.
Figure 8B:
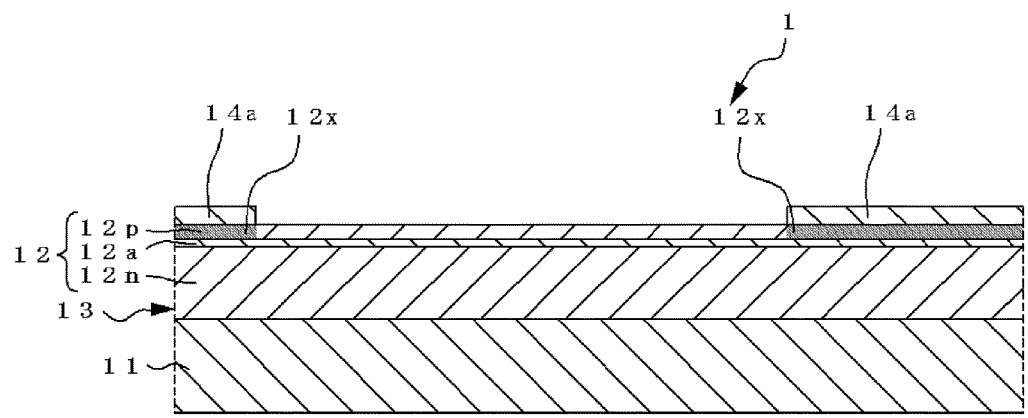
FIG. 8B is a schematic cross sectional view taken along line VIIIB-VIIIB of FIG. 8A.

In the second embodiment, after providing the semiconductor wafer 1 as described in the first embodiment, as shown in FIG. 7A and FIG. 7B, a first portion 14a of a first protective layer 14 is disposed on an upper surface of the p-side nitride semiconductor layer 12p, in regions including regions bordering a plurality of predetermined areas to become a plurality of light emitting elements 200. Subsequently, as shown in FIG. 8A and FIG. 8B, the semiconductor wafer 1 is subjected to annealing to reduce the resistance of the p-side nitride semiconductor layer 12p mainly in the regions other than where the first protective layer 14a is disposed, when seen from above.

Figure 10A:
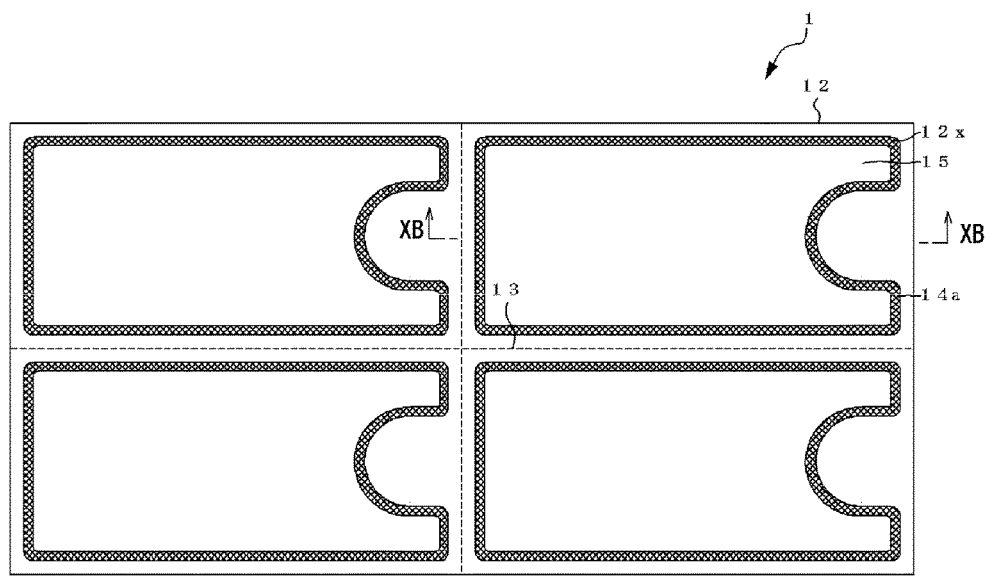
FIG. 10A is a schematic plan view illustrating a method of manufacturing light emitting elements according to the second embodiment.
Figure 10B:
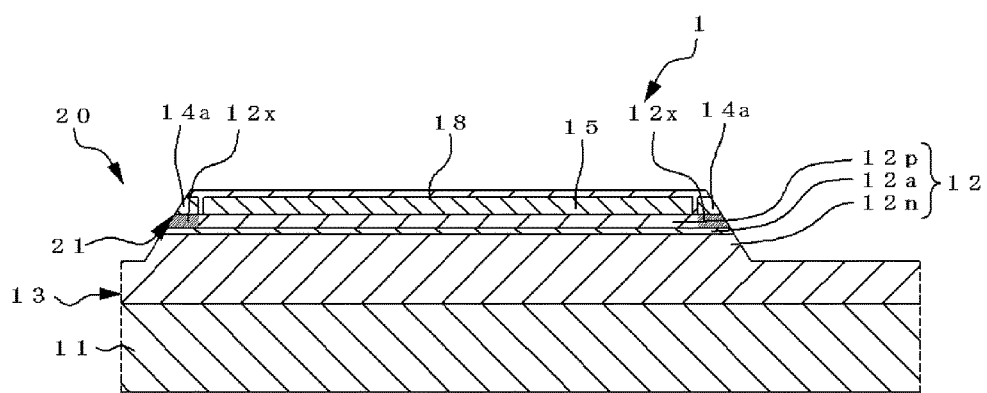
FIG. 10B is a schematic cross sectional view taken along line XB-XB of FIG. 10A.

Then, as shown in FIG. 10A and FIG. 10B, a portion of the semiconductor structure 12 is selectively removed from an upper surface side of the semiconductor structure to expose the n-side nitride semiconductor layer 12n, in regions including regions bordering a plurality of predetermined areas to become a plurality of light emitting elements and located inside where the first portion of the first protective layer was provided when seen from above, to divide the p-side nitride semiconductor layer into a plurality of demarcated element regions.

Then, as shown in FIG. 10A and FIG. 10B, a second portion 14b of the first protective layer is disposed on regions including an exposed lateral surfaces of the semiconductor structure that are formed by the selectively removing the portion of the p-side nitride semiconductor layer.

When the n-side nitride semiconductor layer 12n is exposed by selectively removing a portion of the semiconductor structure 12, a potential difference is formed between the upper surfaces of the light emitting element 200. For this reason, when the current diffusion layer 15 is disposed after partially removing the semiconductor structure 12, electromigration behavior of the current diffusion layer 15 may occur depending on the material of the current diffusion layer 15. However, in the second embodiment, the current diffusion layer 15 can be disposed on the upper surface of the p-side nitride semiconductor layer 12p before partially removing the semiconductor structure 12, which allows for, for example, disposing a cover layer 18 that covers the current diffusion layer 15. Accordingly, electromigration behavior of the current diffusion layer 15 due to the potential difference can be reduced or prevented.

In the description below, the differences from that of the first embodiment will be mainly described.

After providing the semiconductor wafer 1, as shown in FIG. 7A and FIG. 7B, a first portion 14a of a first protective layer 14a is disposed on the p-side nitride semiconductor layer 12p in regions including regions bordering a plurality of predetermined areas to become a plurality of light emitting elements 200. The first portion 14a of the first protective layer 14 can be disposed in any appropriate shape as long as the first portion 14a covers the region that includes the intended separation lines 13. For example, when the intended separation lines 13 of the semiconductor wafer 1 are arranged in a lattice-shape, the first portion 14a is disposed in a shape that covers the lattice-shape of the intended separation lines 13. With this arrangement, occurrence of leakage current can be reduced or prevented in all the lateral surfaces of the plurality of light emitting elements 200. In the second embodiment, the first portion 14a of the first protective layer 14 is disposed so that after the portion of the semiconductor structure 12 is selectively removed in a later step, the first protective layer 14 is disposed on the entire outer periphery of each of the element regions. Note that as shown in FIG. 10A, when the region to dispose the n-pad electrode 16 is provided outside of each of the element regions, the protective layer 14 does not have to be disposed to the portion of the outer periphery of the element region to face the n-pad electrode 16, because the portion has a distance from the closest part of intended separation line 13. This can eliminate the necessity of disposing the first portion 14a in the region described above.

When seen from above, the first portion 14a of the first protective layer 14 preferably has a width, which is typically a width perpendicular to its adjacent intended separation line 13, of 10 μm or greater, more preferably 20 μm or greater. This arrangement can facilitate removing regions located interior of the regions provided with the first portion 14a of the first protective layer 14. When seen from above, the first portion 14a of the first protective layer 14 has a width of, preferably 60 μm or less, more preferably 40 μm or less, further preferably 30 μm or less. With this arrangement, the size of the region in the p-side nitride semiconductor layer 12p with a low resistance can be increased.

Figure 9:
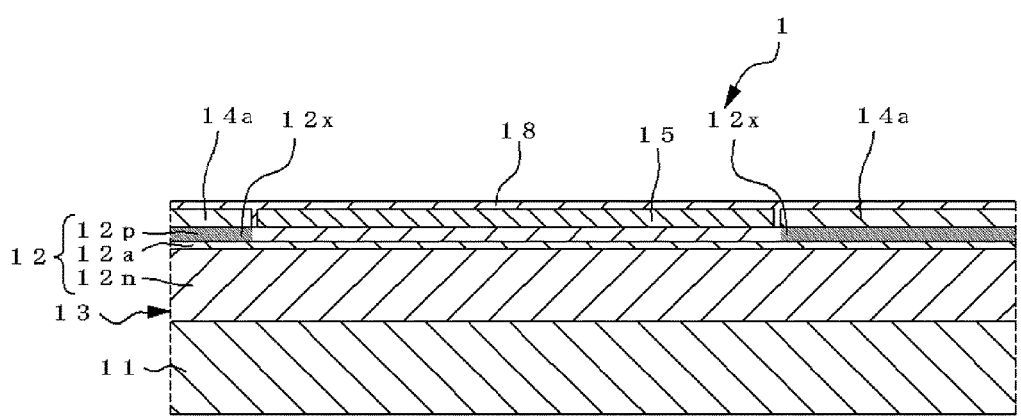
FIG. 9 is a schematic plan view illustrating a method of manufacturing light emitting elements according to the second embodiment.

Subsequently, as shown in FIG. 8A and FIG. 8B, the semiconductor wafer 1 is subjected to annealing to reduce the resistance of the p-side nitride semiconductor layer 12p mainly in the regions other than where the first protective layer 14a is disposed, when seen from above. In the second embodiment, as shown in FIG. 9, after annealing the semiconductor wafer 11 and before selectively removing a portion of the semiconductor structure 12, a current diffusion layer 15 is disposed on approximately the entire upper surface of the p-side nitride semiconductor layer 12p where the first portion 14a of the protective layer 14 is not disposed. Further, as shown in FIG. 9, before selectively removing a portion of the semiconductor structure 12, a cover layer 18 is disposed on an approximately entire upper surface of the semiconductor wafer 1. The cover layer 18 can be disposed on the approximately entire upper surface of the semiconductor wafer 1 by, for example, sputtering SiN, SiO$_2$ or the like. Thus, the upper surface and the lateral surfaces of the current diffusion layer 15 can be covered by the cover layer 18 before selectively removing the portions of the semiconductor structure 12, so that occurrence of electromigration behavior of the current diffusion layer 15 due to the potential difference can be reduced or prevented.

Then, as shown in FIG. 10A and FIG. 10B, selectively removing a portion of the p-side nitride semiconductor layer 12p from an upper surface side of the semiconductor structure 12 to expose the n-side nitride semiconductor layer 12n, in regions including regions bordering a plurality of predetermined areas to become a plurality of light emitting elements 200, and located inside where the first portion 14a of the first protective layer 14 was provided when seen from above, to divide the p-side nitride semiconductor layer 12p into a plurality of demarcated element regions. The width of the portion of the semiconductor structure 12 to be removed, which is typically a width perpendicular to the intended separation lines 13, is preferably 5 μm or greater, more preferably 15 μm or greater. This arrangement can facilitate disposing of the second portion 14b of the first protective layer 14 on the lateral surfaces of the semiconductor structure 12 that are exposed by removing the portion of the semiconductor structure 12. The width of the regions of the semiconductor structure 12 to be removed is preferably 50 μm or less, more preferably 20 μm or less. With this arrangement, the light emitting regions of the light emitting elements 200 can be further increased.

In the second embodiment, as shown in FIG. 2A and FIG. 2B, in addition to the region removed as described above, other portions of the semiconductor structure 12 are removed from the p-side nitride semiconductor layer 12p side by etching to expose the n-side nitride semiconductor layer 12n, to provide regions for disposing n-pad electrodes 16 in a later step.

Figure 11A:
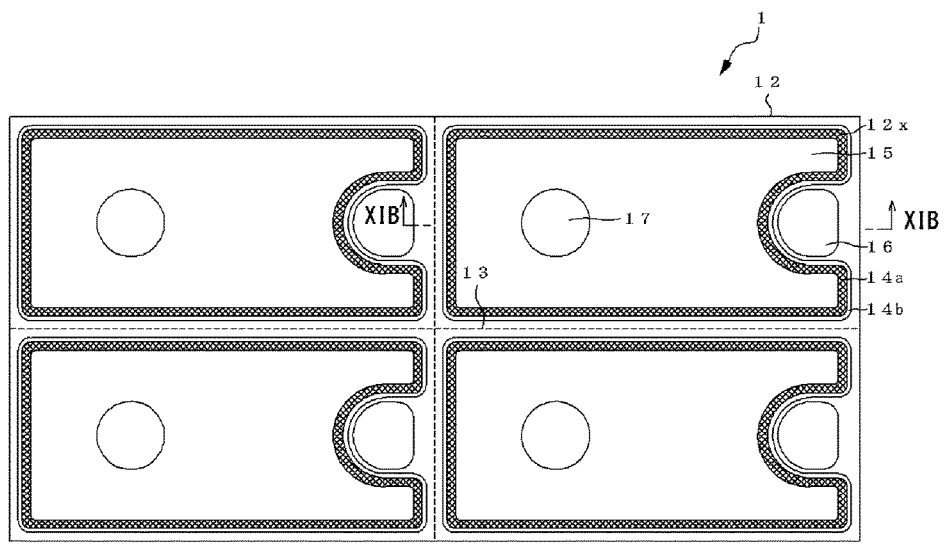
FIG. 11A is a schematic plan view illustrating a method of manufacturing light emitting elements according to the second embodiment.
Figure 11B:
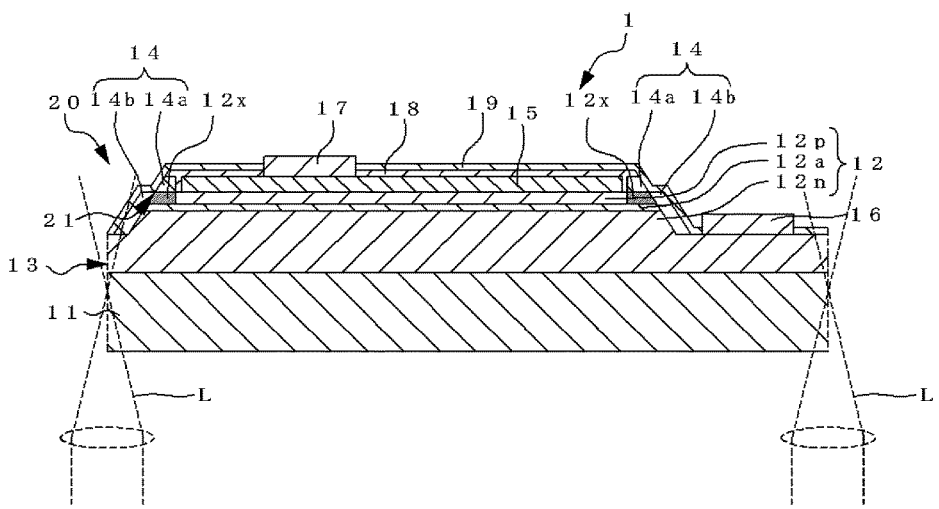
FIG. 11B is a schematic cross sectional view taken along line XIB-XIB of FIG. 11A.

Then, as shown in FIG. 11A and FIG. 11B, a second portion 14b of the first protective layer 14 is disposed on regions including the exposed lateral surfaces of the semiconductor structure 12 that are formed by the selectively removing the portion of the p-side nitride semiconductor layer 12p. In the example shown in FIG. 11A and FIG. 11B, a second protective layer 19 is disposed to cover substantially entire upper surface of the semiconductor wafer 1 including the upper surface of the first portion 14a of the first protective layer 14, except for portions to dispose the n-pad electrodes 16 and the p-pad electrodes 17 in later steps. The second portion 14b of the first protective layer 14 and the second protective layer 19 can be disposed in separate steps, but the second portion 14b of the first protective layer 14 and the second protective layer 19 are preferably disposed in a same step. In this case, the second protective layer 19 may be considered to be disposed as part of the second portion 14b of the first protective layer 14. Subsequently, an n-pad electrode 16 is disposed on a predetermined portion of the semiconductor structure 12, a portion of the cover layer 18 is removed to expose a portion of the current diffusing layer 15, and a p-pad electrode 17 is disposed on the exposed portion of the current diffusing layer 15.

Figure 12A:
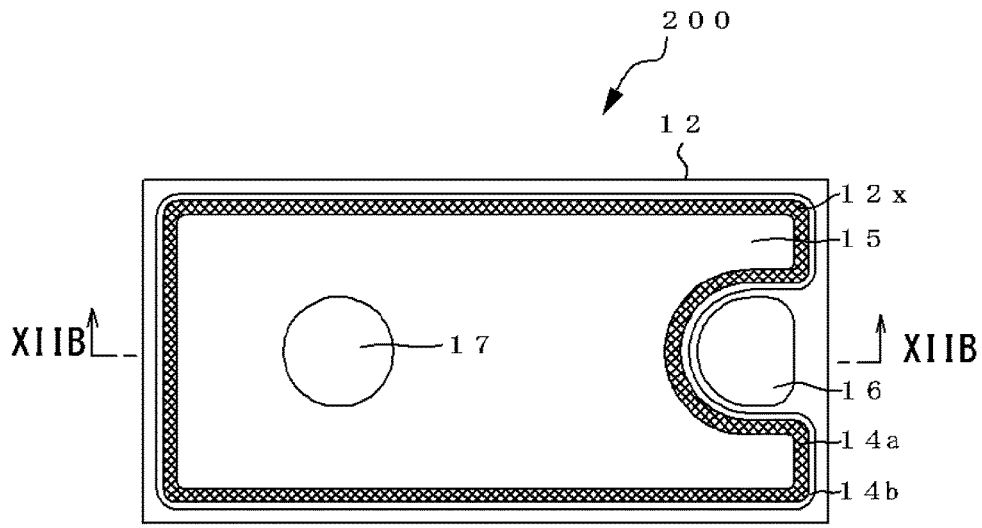
FIG. 12A is a schematic plan view illustrating a method of manufacturing light emitting elements according to the second embodiment.
Figure 12B:
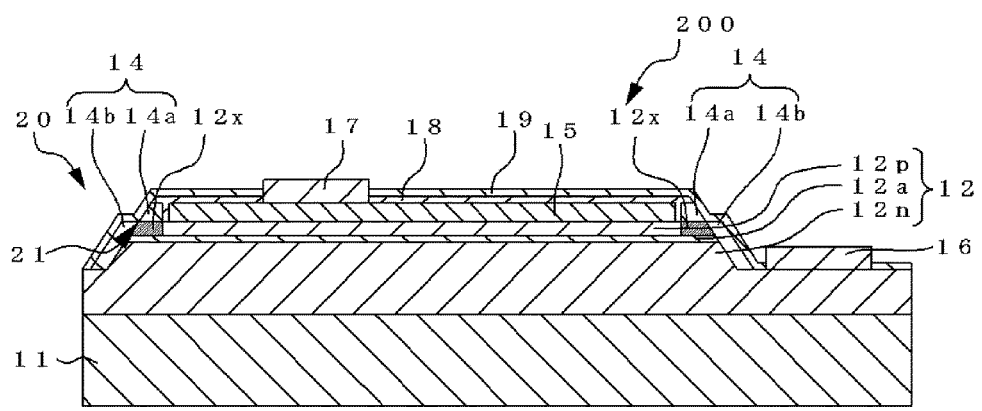
FIG. 12B is a schematic cross sectional view taken along line XIIB-XIIB of FIG. 12A.

Then, as shown in FIG. 11A and FIG. 11B, a laser light L is irradiated to predetermined interior locations of the substrate 11 to form modified regions in the substrate 11. The semiconductor wafer 1 with the substrate 11 formed with the modified regions is divided to obtain a plurality of light emitting elements 200 as shown in FIG. 12A and FIG. 12B.

Example 1

Example 1 will be described with reference to FIG. 1A to FIG. 6B.

As shown in FIG. 1A and FIG. 1B, a semiconductor wafer 1 including a substrate 11, an n-side nitride semiconductor layer 12n containing Si as an n-type dopant and located on an upper surface of the substrate 11, and a p-side nitride semiconductor layer 12p containing Mg as a p-type dopant and located above the n-side nitride semiconductor layer 12n was provided. A sapphire substrate having a thickness of 800 µm was used for the substrate 11, and an n-side nitride semiconductor layer 12n located on the substrate 11, an active layer 12a located on the n-side nitride semiconductor layer 12n, and a p-side nitride semiconductor layer 12p made of GaN, AlGaN, InGaN, or the like and located on the active layer 12a were respectively disposed. Subsequently, as shown in FIG. 2A and FIG. 2B, a portion of the semiconductor layer 12 that include borders (predetermined dividing lines 13) of areas to become a plurality of light emitting elements 100 was selectively removed from an upper surface side of the semiconductor structure 12 to expose the n-side nitride semiconductor layer, so as to divide the p-side nitride semiconductor layer into a plurality of demarcated element regions. The intended separation lines 13 of the semiconductor wafer 1 were arranged in a lattice-shape when viewed from above. In Example 1, as shown in FIG. 2A and FIG. 2B, in addition to the region removed as described above, other portions of the semiconductor structure 12 were removed from the p-side nitride semiconductor layer 12p side by etching to expose the n-side nitride semiconductor layer 12n, so as to provide regions for disposing n-pad electrodes 16 in a later step.

Subsequently, as shown in FIG. 3A and FIG. 3B, a first portion 14a of the first protective layer 14 and a second portion 14b of the first protective layer 14 were disposed on regions including an outer periphery of an upper surface of the p-side nitride semiconductor layer 12p of each of the plurality of demarcated element regions, and exposed lateral surfaces of the semiconductor structure 12 that were formed by the selectively removing the portion of the semiconductor structure 12, respectively. In other words, a first portion 14a of the first protective layer 14a was disposed on the outer peripheral portion of the upper surfaces of the p-side nitride semiconductor layer 12p in the element region, while simultaneously disposing a second portion 14b of the first protective layers 14 on the lateral surfaces of the semiconductor structure 12 that were exposed by removing the portions of the semiconductor structure 12. The first portion 14a of the first protective layer 14 on the upper surface of the p-side nitride semiconductor layer 12p was formed with a width of 6 µm. Subsequently, ITO with a thickness of about 0.1 µm was disposed as the current diffusion layer 15, on approximately the entire upper surface of the p-side nitride semiconductor layer 12p in regions where the first portion 14a of the first protective layer 14 was not disposed. The distance between the current diffusion layer 15 and the first portion 14a of the first protective layer 14a was set to zero.

Subsequently, as shown in FIG. 4A and FIG. 4B, the semiconductor wafer 1 was subjected to annealing in a nitrogen atmosphere at about 500° C. for 40 minutes to reduce the resistance of the p-side nitride semiconductor layer 12p mainly in the regions where the first portion 14a and the second portion 14b of the first protective layer 14 were not disposed when seen from above.

Then, as shown in FIG. 5A and FIG. 5B, the p-pad electrode 17 was disposed on the current diffusion layer 15 that is disposed on the upper surface of the p-side nitride semiconductor layer 12p, and the n-pad electrode was disposed on the exposed portion of the n-side nitride semiconductor layer 12n. For the p-pad electrode 17, Cr, Rh, Pt, and Au were disposed in this order on the current diffusion layer 15. For the n-pad electrode 16, Ti, Al, Ti, Ru, Ti, Cr, Rh, Pt, and Au were disposed in this order on the n-side nitride semiconductor layer 12n. The second protective layer 19 made of $SiO_2$ was disposed with a thickness of about 0.2 µm on approximately the entire upper surface of the semiconductor wafer 1 except for the p-pad electrodes 17 and the n-pad electrodes 16. Then, the thickness of the substrate 11 was reduced to 150 µm through polishing the substrate 11 from the lower side.

Subsequently, as shown in FIG. 5A and FIG. 5B, the laser beam L was irradiated in the substrate 11 from the lower surface side of the substrate 11, to predetermined regions corresponding to the intended separation lines 13. The laser light L was irradiated to locations 100 µm from the upper surface of the substrate 11. A fiber laser configured to emit laser light with a wavelength of 1064 nm, a pulse width of about 1 psec, and an output power of about 0.3 W was used to generate the laser light L.

Then, the semiconductor wafer 1 was divided along the intended separation lines 13 to obtain a plurality of light emitting elements 100. The semiconductor wafer 1 was divided by placing a roller to the lower surface of the substrate 11 along the intended separation line 13 and applying a force thereto. Accordingly, a plurality of light emitting elements 100 each having a rectangular shape when seen from above, with a long side of 755 μm and a short side of 205 μm were obtained.

Figure 14A:
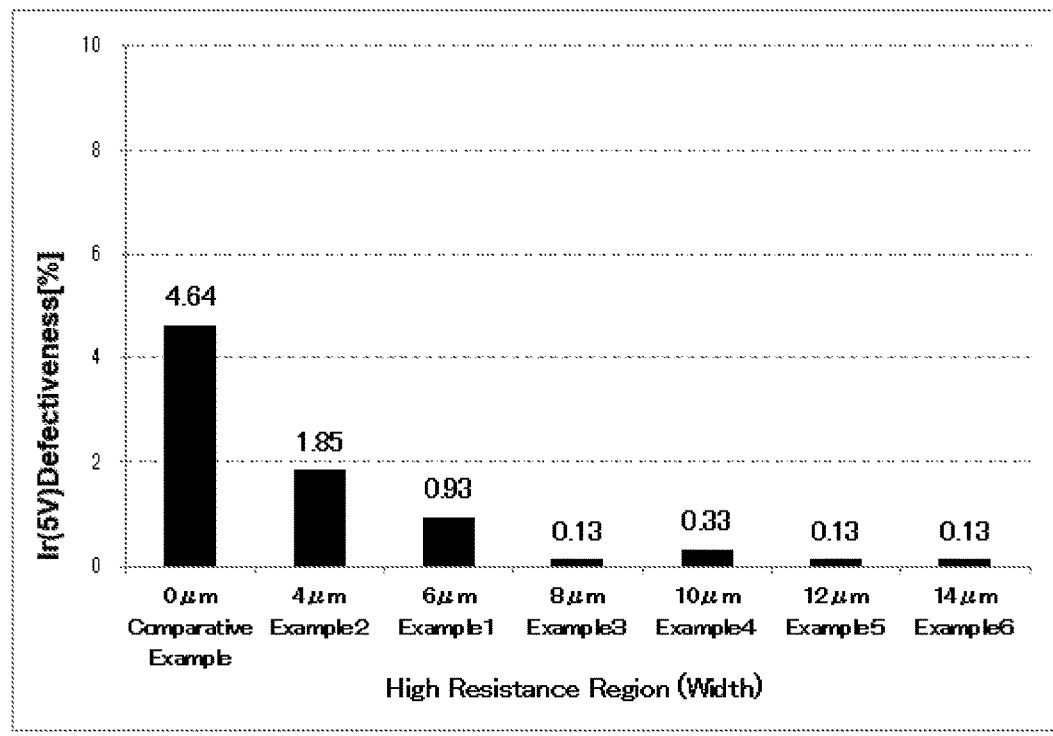
FIG. 14A is a graph showing measurement results of reverse current values of light emitting elements according to Examples 1 to 6, and Comparative Example.

The plurality of light emitting elements 100 were then subjected to measurement of electric current flow (may be referred to as "Ir" below) in supplying a reverse voltage of 5 V. The results of the measurements are shown in FIG. 14A. Among the light emitting elements 100 obtained in Example 1, 0.93% of the light emitting elements 100 exhibited Ir of 0.3 mA or greater that is determined as defective. Thus, compared to the light emitting elements obtained in Comparative Example to be illustrated later below, which exhibited 4.64% of defectiveness, the light emitting elements 100 of Example 1 demonstrated a sufficient reduction in occurrence of leakage current. Further, the light emitting elements 100 were subjected to measurement of light emission output upon being supplied with an electric current of 20 mA.

Figure 14B:
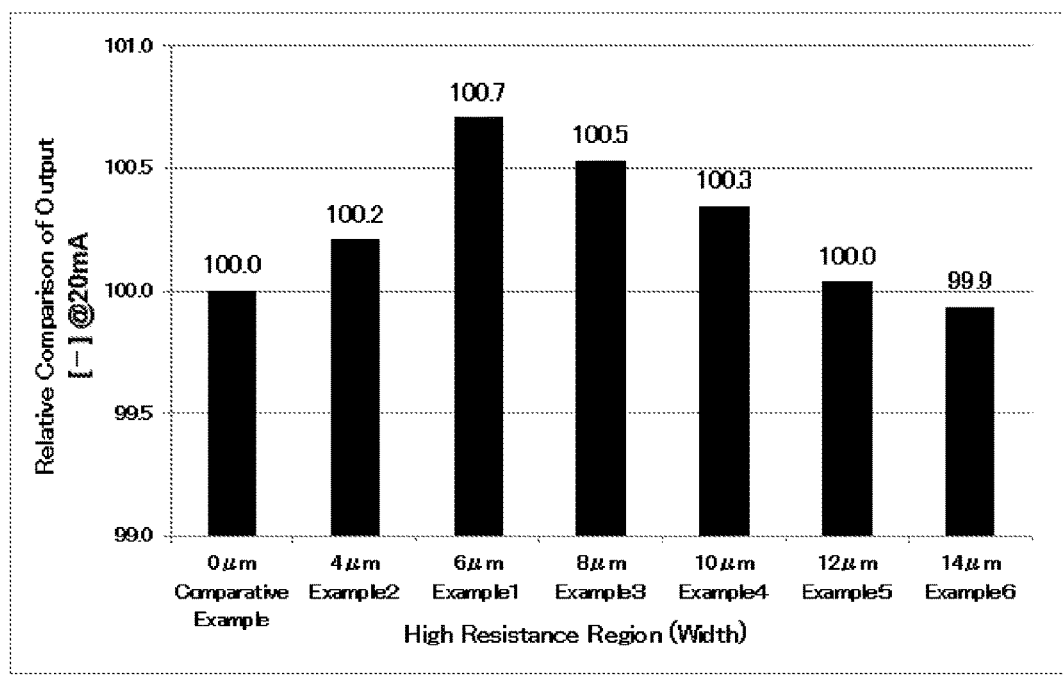
FIG. 14B is a graph showing measurement results of optical output values of light emitting elements according to Examples 1 to 6, and Comparative Example.

The results of the measurements are shown in FIG. 14B. Assuming the emission output of the light emitting elements 300 according to Comparative Example to be shown further below as 100, the light emitting elements 100 obtained in Example 1 exhibited light emission output of 100.7, and demonstrated an improvement in the light emission output.

Example 2

The light emitting elements were produced in a similar manner as those in Example 1, except that the width of the first portion 14*a* of the first protective layer 14 was set to 4 Among the light emitting elements obtained in Example 2, as shown in FIG. 14A, 1.85% of the light emitting elements exhibited defective Ir, which also demonstrated a sufficient reduction in occurrence of leakage current compared to the light emitting elements obtained in Comparative Example, which exhibited 4.64% of defectiveness. Further, the light emitting elements obtained in Example 2 were subjected to measurement of light emission output upon being supplied with an electric current of 20 mA. As the results of the measurements shown in FIG. 14B, the light emitting elements obtained in Example 2 exhibited light emission output of 100.2, and demonstrated an improvement in the light emission output, compared to the light emission output of the light emitting elements obtained in Comparative Example that is assumed 100.

Example 3

The light emitting elements were produced in a similar manner as those in Example 1, except that the width of the first portion 14*a* of the first protective layer 14 was set to 8 Among the light emitting elements obtained in Example 3, as shown in FIG. 14A, 0.13% of the light emitting elements exhibited defective Ir, which also demonstrated a sufficient reduction in occurrence of leakage current compared to the light emitting elements obtained in Comparative Example, which exhibited 4.64% of defectiveness. Further, the light emitting elements obtained in Example 3 were subjected to measurement of light emission output upon being supplied with an electric current of 20 mA. As the results of the measurements shown in FIG. 14B, the light emitting elements obtained in Example 3 exhibited light emission output of 100.5, and demonstrated an improvement in the light emission output, compared to the light emission output of the light emitting elements obtained in Comparative Example that is assumed 100.

Example 4

The light emitting elements were produced in a similar manner as those in Example 1, except that the width of the first portion 14*a* of the first protective layer 14 was set to 10 Among the light emitting elements obtained in Example 4, as shown in FIG. 14A, 0.33% of the light emitting elements exhibited defective Ir, which also demonstrated a sufficient reduction in occurrence of leakage current compared to the light emitting elements obtained in Comparative Example, which exhibited 4.64% of defectiveness. Further, the light emitting elements obtained in Example 4 were subjected to measurement of light emission output upon being supplied with an electric current of 20 mA. As the results of the measurements shown in FIG. 14B, the light emitting elements obtained in Example 4 exhibited light emission output of 100.3, and demonstrated an improvement in the light emission output, compared to the light emission output of the light emitting elements obtained in Comparative Example that is assumed 100.

Example 5

The light emitting elements were produced in a similar manner as those in Example 1, except that the width of the first portion 14*a* of the first protective layer 14 was set to 12 Among the light emitting elements obtained in Example 5, as shown in FIG. 14A, 0.13% of the light emitting elements exhibited defective Ir, which also demonstrated a sufficient reduction in occurrence of leakage current compared to the light emitting elements obtained in Comparative Example, which exhibited 4.64% of defectiveness. Further, the light emitting elements obtained in Example 5 were subjected to measurement of light emission output upon being supplied with an electric current of 20 mA. As the results of the measurements shown in FIG. 14B, the light emitting elements obtained in Example 2 exhibited light emission output of 100.0, and demonstrated similar light emission output compared to the light emission output of the light emitting elements obtained in Comparative Example that is assumed 100.

This is thought due to an excessive width of the first portion 14*a* of the first protective layer 14.

Example 6

The light emitting elements were produced in a similar manner as those in Example 1, except that the width of the first portion 14*a* of the first protective layer 14 was set to 14 μm. Among the light emitting elements obtained in Example 6, as shown in FIG. 14A, 0.13% of the light emitting elements exhibited defective Ir, which also demonstrated a sufficient reduction in occurrence of leakage current compared to the light emitting elements obtained in Comparative Example, which exhibited 4.64% of defectiveness. Further, the light emitting elements obtained in Example 6 were subjected to measurement of light emission output upon being supplied with an electric current of 20 mA. As the results of the measurements shown in FIG. 14B, the light emitting elements obtained in Example 6 exhibited light emission output of 99.9, and demonstrated a decrease in the light emission output, compared to the light emission output of the light emitting elements obtained in Comparative Example that is assumed 100. This is thought due to an excessive width of the first portion 14*a* of the first protective layer 14.

Comparative Example

Figure 13A:
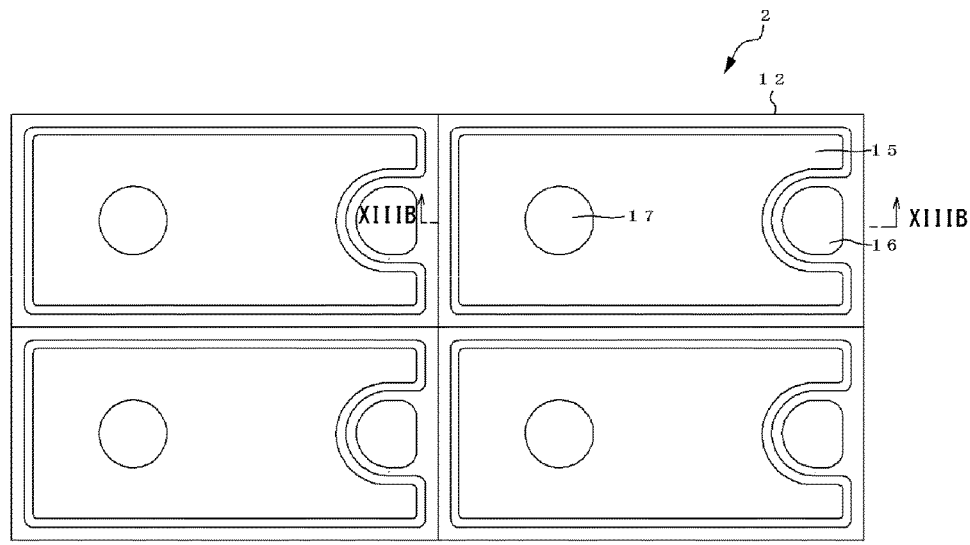
FIG. 13A is a schematic plan view illustrating a method of manufacturing light emitting elements according to Comparative Example.
Figure 13B:
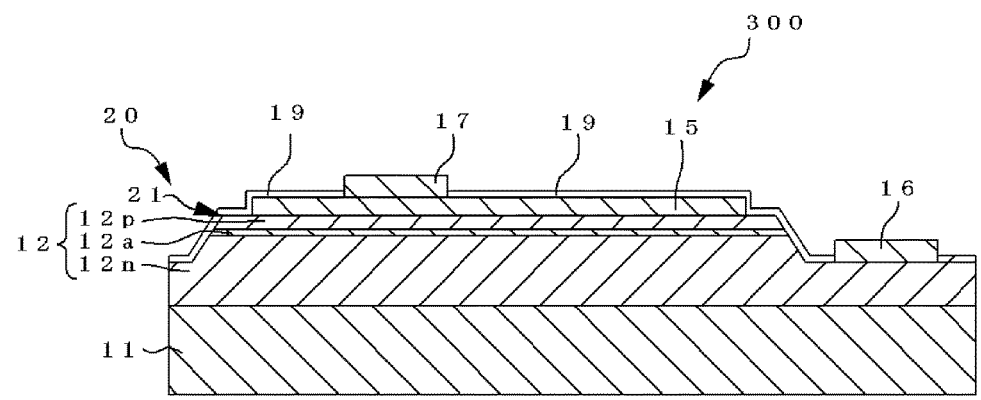
FIG. 13B is a schematic cross sectional view taken along line XIIIB-XIIIB of FIG. 13A.

In the Comparative Example, as shown in FIG. 13A and FIG. 13B, the light emitting elements 300 were provided in a similar manner as in Example 1, except that the light emitting elements 300 were obtained from a second wafer 2 in which the first portion 14a of the first protective layer 14 and the second portion 14b of the first protective layer 14 were not provided to the semiconductor structure 12. That is, the resistance of the entire surface of the p-side nitride semiconductor layer 12p was reduced by annealing, and thus high-resistance portions 12x were absent in the corner portions 21. As described above, other configurations are similar to those in Example 1.

In the Comparative Example, a plurality of light emitting elements 300 each having a rectangular shape when seen from above, with a long side of 755 μm and a short side of 205 μm were produced. The plurality of light emitting elements 300 were then subjected to measurement of electric current flow Ir in supplying a reverse voltage of 5 V. The results of the measurements are shown in FIG. 14A. Among the light emitting elements 300 obtained in the Comparative Example, 4.64% of the light emitting elements 300 exhibited Ir of 0.3 mA or greater that is determined as defective, and indicated that occurrence of leakage current was not sufficiently reduced in the light emitting elements 300 obtained in the Comparative Example.

In each of the light emitting elements 300 according to the Comparative Example, the first portion 14a of the first protective layer 14a was not disposed on the portion of the upper surface of the p-side nitride semiconductor layer 12p as in the light emitting elements 100 according to Examples 1 to 6. Thus, the light emitting elements 300 have larger light emission regions. Meanwhile, high-resistance portions 12x were not arranged at the corner portions 21 in the light emitting elements 300. Thus, it is assumed that the corner portions 21 were damaged by the laser light L, which resulted in the occurrence of leakage current. Further, it is assumed that occurrence of leakage current reduced the electric current contributing to light emission of the light emitting elements 300, resulting in lower light emission output compared to the light emitting elements 100 of Examples 1 to 4. On the other hand, the light emitting elements 100 according to Examples 1 to 6 were provided with the high-resistance portions 12x at the corner portions 21 of the light emitting elements 100, which allowed for sufficient reduction in occurrence of leakage current compared to the light emitting elements 300 according to the Comparative Example. Further, as a result of the above, an increase in the electric current contributing to light emission of the light emitting elements 100 was achieved in the light emitting elements 100 according to examples 1 to 4, thus allowing an increase in light emission output, even with smaller light emitting regions compared to that of the light emitting elements of the Comparative Example.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a plurality of light emitting elements, the method comprising:
    providing a semiconductor wafer comprising:
        a substrate, and
        a semiconductor structure comprising:
            an n-side nitride semiconductor layer containing an n-type dopant and located above the substrate, and
            a p-side nitride semiconductor layer containing a p-type dopant and located above the n-side nitride semiconductor layer;
    selectively removing a portion of the semiconductor structure from an upper surface side of the semiconductor structure to expose the n-side nitride semiconductor layer, in regions that include borders of areas to become the plurality of light emitting elements in a top view, such that the p-side nitride semiconductor layer includes a plurality of demarcated element regions;
    disposing a protective layer on regions including an outer periphery of an upper surface of the p-side nitride semiconductor layer of each of the plurality of demarcated element regions and exposed lateral surfaces of the semiconductor structure that are formed by selectively removing the portion of the semiconductor structure;
    annealing the semiconductor wafer to reduce a resistance of regions of the p-side nitride semiconductor layer where the protective layer is not provided in a top view;
    irradiating laser light in an interior region of the substrate so as to form modified regions in the substrate; and
    dividing the semiconductor wafer along the borders of said areas by using the modified regions, so as to separate the areas into a plurality of separated individual light emitting elements.

2. The method according to claim 1, wherein the protective layer is made of SiO2.

3. The method according to claim 1, further comprising, after the step of disposing the protective layer, disposing a current diffusion layer on substantially the entire upper surface of the p-side nitride semiconductor layer in regions that are not provided with the protective layer.

4. The method according to claim 3, wherein the current diffusion layer is made of ITO.

5. The method according to claim 1, wherein, in the step of disposing the protective layer, the protective layer is disposed on an entire outer periphery of each of the element regions.

6. The method according to claim 1, wherein, in the step of forming the modified regions, the modified regions are formed in an upper half region in a thickness direction of the substrate.

7. The method according to claim 1, wherein, in the step of forming the modified regions, two or more modified regions are formed at different depths in a thickness direction of the substrate.

8. The method according to claim 1, wherein, in the step of forming the modified regions, the laser light is irradiated in range of 10 μm to 150 μm from the upper surface of substrate.

9. The method according to claim 1, wherein the step of forming the modified regions comprises:
    irradiating a laser beam with a first pulse energy and a first pitch to form first modified regions in the substrate, and irradiating a laser beam with a second pulse energy that is smaller than the first pulse energy and a second pitch that is smaller than the first pitch to form second modified regions above the first modified regions.

10. The method according to claim 1, wherein the semiconductor structure is made of GaN.

11. A method of manufacturing a plurality of light emitting elements, the method comprising:
    providing a semiconductor wafer including:
        a substrate, and a semiconductor structure comprising:
- an n-side nitride semiconductor layer containing an n-type dopant and located above the substrate, and
- a p-side nitride semiconductor layer containing a p-type dopant and located above the n-side nitride semiconductor layer;

disposing a first portion of a first protective layer on an upper surface of the p-side nitride semiconductor layer, in regions that include borders of areas to become the plurality of light emitting elements;

annealing the semiconductor wafer to reduce a resistance of regions of the p-side nitride semiconductor layer where the first portion of the first protective layer is not provided in a top view;

selectively removing a portion of the semiconductor structure from an upper surface side of the semiconductor structure to expose the n-side nitride semiconductor layer, in regions that include borders of areas to become the plurality of light emitting elements and located inside where the first portion of the first protective layer was provided in a top view, such that the p-side nitride semiconductor layer includes a plurality of demarcated element regions;

disposing a second portion of the first protective layer on regions including exposed lateral surfaces of the semiconductor structure that are formed by selectively removing the portion of the semiconductor structure;

irradiating laser light in an interior region of the substrate so as to form modified regions in the substrate; and dividing the semiconductor wafer along the borders of said areas using the modified regions, so as to separate the areas into a plurality of separated individual light emitting elements.

12. The method according to claim 11, further comprising, after the step of annealing the semiconductor wafer, disposing a current diffusion layer on substantially the entire upper surface of the p-side nitride semiconductor layer in regions that are not provided with the first portion of the first protective layer.

13. The method according to claim 12, further comprising, after the step of disposing a current diffusion layer, disposing a cover layer over the upper surface and the lateral surface of the current diffusion layer.

14. The method according to claim 13, wherein the cover layer is made of SiN.

15. The method according to claim 13, wherein in the step of forming the modified regions, first modified regions are formed in a lower half region in the thickness direction of the substrate, and second modified regions are formed in an upper half region in the thickness direction of the substrate.

16. The method according to claim 12, wherein the current diffusion layer is made of Ag.

17. The method according to claim 11, wherein, in the step of disposing the second portion of the first protective layer, the second portion of the first protective layer is disposed to cover substantially an entire upper surface of the semiconductor wafer, including the upper surface of the first portion of the first protective layer.

18. The method according to claim 11, wherein, in the step of disposing the first portion of the first protective layer, the first portion of the first protective layer is disposed in a lattice-shape on the upper surface of the p-side nitride semiconductor layer.

\* \* \* \* \*